US009343368B2

(12) United States Patent
Janzen et al.

(10) Patent No.: US 9,343,368 B2
(45) Date of Patent: *May 17, 2016

(54) DISABLING ELECTRICAL CONNECTIONS USING PASS-THROUGH 3D INTERCONNECTS AND ASSOCIATED SYSTEMS AND METHODS

(71) Applicants: Micron Technology, Inc., Boise, ID (US); Russell D. Slifer, Boise, ID (US)

(72) Inventors: Jeffery W. Janzen, Boise, ID (US); Michael Chaine, Boise, ID (US); Kyle K. Kirby, Eagle, ID (US); William M. Hiatt, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/324,958

(22) Filed: Jul. 7, 2014

(65) Prior Publication Data

US 2014/0319697 A1    Oct. 30, 2014

Related U.S. Application Data

(60) Continuation of application No. 13/850,803, filed on Mar. 26, 2013, now Pat. No. 8,772,086, which is a continuation of application No. 13/572,461, filed on Aug. 10, 2012, now Pat. No. 8,404,521, which is a division of application No. 12/121,654, filed on May 15, 2008, now Pat. No. 8,253,230.

(51) Int. Cl.
*H01L 21/768* (2006.01)
*H01L 23/48* (2006.01)
(Continued)

(52) U.S. Cl.
CPC ............ *H01L 21/82* (2013.01); *H01L 21/50* (2013.01); *H01L 21/76898* (2013.01);
(Continued)

(58) Field of Classification Search
CPC ............ H01L 21/76898; H01L 23/481; H01L 23/525; H01L 23/60; H01L 25/0657; H01L 25/50; H01L 21/50; H01L 23/52; H01L 21/82; H01L 23/62; H01L 27/0248; H01L 27/0292
See application file for complete search history.

(56) References Cited

U.S. PATENT DOCUMENTS

| 5,145,099 A | 9/1992 | Wood et al. |
| 5,233,448 A | 8/1993 | Wu |

(Continued)

FOREIGN PATENT DOCUMENTS

| KR | 2002-0022122 | 3/2002 |
| WO | 2005/036940 | 4/2005 |
| WO | 2006/053036 | 5/2006 |

OTHER PUBLICATIONS

Bernstein, K et al., "Interconnects in the Third Dimension: Design Challenges for 3D ICs," Design Automation Conference, 2007, DAC '07, 44th ACM/IEEE, Jun. 4-8, 2007, pp. 562-567.

(Continued)

*Primary Examiner* — Jarrett Stark
*Assistant Examiner* — Bitew Dinke
(74) *Attorney, Agent, or Firm* — Perkins Coie LLP

(57) ABSTRACT

Pass-through 3D interconnects and microelectronic dies and systems of stacked dies that include such interconnects to disable electrical connections are disclosed herein. In one embodiment, a system of stacked dies includes a first microelectronic die having a backside, an interconnect extending through the first die to the backside, an integrated circuit electrically coupled to the interconnect, and a first electrostatic discharge (ESD) device electrically isolated from the interconnect. A second microelectronic die has a front side coupled to the backside of the first die, a metal contact at the front side electrically coupled to the interconnect, and a second ESD device electrically coupled to the metal contact. In another embodiment, the first die further includes a substrate carrying the integrated circuit and the first ESD device, and the interconnect is positioned in the substrate to disable an electrical connection between the first ESD device and the interconnect.

27 Claims, 7 Drawing Sheets

(51) Int. Cl.
*H01L 21/82* (2006.01)
*H01L 23/525* (2006.01)
*H01L 23/60* (2006.01)
*H01L 25/065* (2006.01)
*H01L 25/00* (2006.01)
*H01L 21/50* (2006.01)
*H01L 23/52* (2006.01)
*H01L 23/62* (2006.01)

(52) U.S. Cl.
CPC ............ *H01L 23/481* (2013.01); *H01L 23/52* (2013.01); *H01L 23/525* (2013.01); *H01L 23/60* (2013.01); *H01L 23/62* (2013.01); *H01L 25/0657* (2013.01); *H01L 25/50* (2013.01); *H01L 2224/02372* (2013.01); *H01L 2224/0401* (2013.01); *H01L 2224/13009* (2013.01); *H01L 2224/13025* (2013.01); *H01L 2224/16145* (2013.01); *H01L 2224/16225* (2013.01); *H01L 2225/06513* (2013.01); *H01L 2225/06517* (2013.01); *H01L 2225/06541* (2013.01); *H01L 2924/13034* (2013.01)

(56) References Cited

U.S. PATENT DOCUMENTS

| | | | |
|---|---|---|---|
| 5,644,167 A * | 7/1997 | Weiler et al. | 257/777 |
| 5,654,221 A | 8/1997 | Cronin et al. | |
| 5,776,824 A | 7/1998 | Farnworth et al. | |
| 5,821,532 A | 10/1998 | Beaman et al. | |
| 5,851,845 A | 12/1998 | Wood et al. | |
| 6,008,070 A | 12/1999 | Farnworth | |
| 6,097,087 A | 8/2000 | Farnworth et al. | |
| 6,103,547 A | 8/2000 | Corisis et al. | |
| 6,114,240 A | 9/2000 | Akram et al. | |
| 6,124,634 A | 9/2000 | Akram et al. | |
| 6,133,622 A | 10/2000 | Corisis et al. | |
| 6,159,764 A | 12/2000 | Kinsman et al. | |
| 6,184,465 B1 | 2/2001 | Corisis | |
| 6,222,270 B1 | 4/2001 | Lee et al. | |
| 6,228,687 B1 | 5/2001 | Akram et al. | |
| 6,229,202 B1 | 5/2001 | Corisis | |
| 6,246,108 B1 | 6/2001 | Corisis et al. | |
| 6,271,580 B1 | 8/2001 | Corisis | |
| 6,291,894 B1 * | 9/2001 | Farnworth et al. | 257/780 |
| 6,294,837 B1 | 9/2001 | Akram et al. | |
| 6,326,697 B1 | 12/2001 | Farnworth | |
| 6,576,531 B2 | 6/2003 | Peng et al. | |
| 6,582,992 B2 | 6/2003 | Poo et al. | |
| 6,620,731 B1 | 9/2003 | Farnworth et al. | |
| 6,774,486 B2 | 8/2004 | Kinsman | |
| 6,797,616 B2 | 9/2004 | Kinsman | |
| 6,809,025 B2 | 10/2004 | Sandhu et al. | |
| 6,828,175 B2 | 12/2004 | Wood et al. | |
| 6,858,891 B2 | 2/2005 | Farnworth et al. | |
| 6,885,107 B2 | 4/2005 | Kinsman | |
| 6,903,442 B2 | 6/2005 | Wood et al. | |
| 6,903,443 B2 | 6/2005 | Farnworth et al. | |
| 6,913,952 B2 | 7/2005 | Moxham et al. | |
| 6,946,325 B2 | 9/2005 | Yean et al. | |
| 7,023,090 B2 | 4/2006 | Huang et al. | |
| 7,037,836 B2 | 5/2006 | Lee | |
| 7,083,425 B2 | 8/2006 | Chong et al. | |
| 7,084,073 B2 | 8/2006 | Lee et al. | |
| 7,091,124 B2 | 8/2006 | Rigg et al. | |
| 7,109,068 B2 | 9/2006 | Akram et al. | |
| 7,164,565 B2 | 1/2007 | Takeda | |
| 7,183,653 B2 | 2/2007 | Myers et al. | |
| 7,190,061 B2 | 3/2007 | Lee et al. | |
| 7,199,050 B2 | 4/2007 | Hiatt | |
| 7,217,596 B2 | 5/2007 | Cobbley et al. | |
| 7,217,888 B2 | 5/2007 | Sunohara et al. | |
| 7,232,754 B2 | 6/2007 | Kirby et al. | |
| 7,262,134 B2 | 8/2007 | Kirby et al. | |
| 7,265,052 B2 | 9/2007 | Sinha | |
| 7,271,482 B2 | 9/2007 | Kirby | |
| 7,300,857 B2 | 11/2007 | Akram et al. | |
| 7,800,238 B2 | 9/2010 | Pratt | |
| 7,808,075 B1 * | 10/2010 | Cheng et al. | 257/528 |
| 7,968,431 B2 | 6/2011 | Hsieh et al. | |
| 8,253,230 B2 * | 8/2012 | Janzen et al. | 257/686 |
| 8,350,364 B2 | 1/2013 | Hedler et al. | |
| 8,404,521 B2 | 3/2013 | Janzen et al. | |
| 8,772,086 B2 * | 7/2014 | Janzen et al. | 438/109 |
| 2001/0000013 A1 | 3/2001 | Lin | |
| 2002/0130390 A1 | 9/2002 | Ker et al. | |
| 2003/0199119 A1 | 10/2003 | Lin | |
| 2003/0216023 A1 | 11/2003 | Wark et al. | |
| 2004/0041261 A1 | 3/2004 | Kinsman | |
| 2004/0043607 A1 | 3/2004 | Farnworth et al. | |
| 2004/0119159 A1 * | 6/2004 | Takahashi | 257/723 |
| 2004/0178491 A1 | 9/2004 | Akram et al. | |
| 2004/0178495 A1 * | 9/2004 | Yean et al. | 257/723 |
| 2004/0198033 A1 | 10/2004 | Lee et al. | |
| 2005/0046002 A1 | 3/2005 | Lee et al. | |
| 2005/0069782 A1 | 3/2005 | Elenius et al. | |
| 2005/0104228 A1 | 5/2005 | Rigg et al. | |
| 2005/0110095 A1 | 5/2005 | Shih et al. | |
| 2005/0110889 A1 | 5/2005 | Tuttle et al. | |
| 2005/0127478 A1 | 6/2005 | Hiatt et al. | |
| 2005/0150683 A1 | 7/2005 | Farnworth et al. | |
| 2005/0164500 A1 | 7/2005 | Lindgren | |
| 2005/0184219 A1 | 8/2005 | Kirby | |
| 2005/0208766 A1 | 9/2005 | Kirby et al. | |
| 2005/0227382 A1 | 10/2005 | Hui | |
| 2005/0231626 A1 | 10/2005 | Tuttle et al. | |
| 2005/0236708 A1 | 10/2005 | Farnworth et al. | |
| 2005/0247894 A1 | 11/2005 | Watkins et al. | |
| 2005/0253213 A1 | 11/2005 | Jiang et al. | |
| 2005/0254133 A1 | 11/2005 | Akram et al. | |
| 2005/0275048 A1 * | 12/2005 | Farnworth et al. | 257/431 |
| 2005/0275049 A1 | 12/2005 | Kirby et al. | |
| 2005/0275051 A1 | 12/2005 | Farnworth et al. | |
| 2005/0275750 A1 | 12/2005 | Akram et al. | |
| 2005/0285154 A1 | 12/2005 | Akram et al. | |
| 2006/0011809 A1 | 1/2006 | Farnworth et al. | |
| 2006/0014313 A1 | 1/2006 | Hall et al. | |
| 2006/0023107 A1 | 2/2006 | Bolken et al. | |
| 2006/0024856 A1 | 2/2006 | Derderian et al. | |
| 2006/0035402 A1 | 2/2006 | Street et al. | |
| 2006/0035415 A1 | 2/2006 | Wood et al. | |
| 2006/0038183 A1 | 2/2006 | Oliver | |
| 2006/0040421 A1 | 2/2006 | Farnworth et al. | |
| 2006/0040428 A1 | 2/2006 | Johnson | |
| 2006/0042952 A1 | 3/2006 | Oliver et al. | |
| 2006/0043262 A1 | 3/2006 | Akram | |
| 2006/0043509 A1 | 3/2006 | Watkins et al. | |
| 2006/0043512 A1 | 3/2006 | Oliver et al. | |
| 2006/0043535 A1 | 3/2006 | Hiatt | |
| 2006/0043569 A1 | 3/2006 | Benson et al. | |
| 2006/0044433 A1 | 3/2006 | Akram | |
| 2006/0046332 A1 | 3/2006 | Derderian et al. | |
| 2006/0046438 A1 | 3/2006 | Kirby | |
| 2006/0046468 A1 | 3/2006 | Akram et al. | |
| 2006/0046471 A1 | 3/2006 | Kirby et al. | |
| 2006/0148250 A1 | 7/2006 | Kirby | |
| 2006/0151880 A1 | 7/2006 | Tang et al. | |
| 2006/0154153 A1 | 7/2006 | Chiang et al. | |
| 2006/0177959 A1 | 8/2006 | Boettiger et al. | |
| 2006/0177999 A1 | 8/2006 | Hembree et al. | |
| 2006/0180941 A1 | 8/2006 | Kirby et al. | |
| 2006/0186097 A1 | 8/2006 | Watkins et al. | |
| 2006/0186492 A1 | 8/2006 | Boettiger et al. | |
| 2006/0191882 A1 | 8/2006 | Watkins et al. | |
| 2006/0199363 A1 | 9/2006 | Kirby et al. | |
| 2006/0208360 A1 | 9/2006 | Yiu et al. | |
| 2006/0216862 A1 | 9/2006 | Rigg et al. | |
| 2006/0264041 A1 * | 11/2006 | Rigg et al. | 438/667 |
| 2006/0270108 A1 | 11/2006 | Farnworth et al. | |
| 2006/0289968 A1 | 12/2006 | Sulfridge | |
| 2006/0290001 A1 | 12/2006 | Sulfridge | |
| 2006/0292877 A1 | 12/2006 | Lake | |
| 2007/0004079 A1 | 1/2007 | Geefay et al. | |

(56) References Cited

U.S. PATENT DOCUMENTS

| | | |
|---|---|---|
| 2007/0032061 A1 | 2/2007 | Farnworth et al. |
| 2007/0045388 A1 | 3/2007 | Farnworth et al. |
| 2007/0045515 A1 | 3/2007 | Farnworth et al. |
| 2007/0045632 A1 | 3/2007 | Oliver et al. |
| 2007/0045779 A1 | 3/2007 | Hiatt |
| 2007/0045812 A1 | 3/2007 | Heng |
| 2007/0045826 A1 | 3/2007 | Lee et al. |
| 2007/0045834 A1 | 3/2007 | Chong et al. |
| 2007/0048896 A1 | 3/2007 | Andry et al. |
| 2007/0048994 A1 | 3/2007 | Tuttle |
| 2007/0049016 A1 | 3/2007 | Hiatt et al. |
| 2007/0057028 A1 | 3/2007 | Lake et al. |
| 2007/0077753 A1 | 4/2007 | Iwatake et al. |
| 2007/0126091 A1 | 6/2007 | Wood et al. |
| 2007/0152342 A1 | 7/2007 | Tsao et al. |
| 2007/0158853 A1 | 7/2007 | Sinha |
| 2007/0166991 A1 | 7/2007 | Sinha |
| 2007/0170574 A1 | 7/2007 | Lauxtermann et al. |
| 2007/0178694 A1 | 8/2007 | Hiatt |
| 2007/0190803 A1 | 8/2007 | Singh et al. |
| 2007/0197013 A1 | 8/2007 | Trezza |
| 2007/0202617 A1 | 8/2007 | Hembree |
| 2007/0222050 A1 | 9/2007 | Lee et al. |
| 2007/0222054 A1 | 9/2007 | Hembree |
| 2007/0262424 A1 | 11/2007 | Hiatt |
| 2008/0050904 A1 | 2/2008 | Lake |
| 2008/0050911 A1 | 2/2008 | Borthakur |
| 2008/0054444 A1* | 3/2008 | Tuttle ............................ 257/698 |
| 2008/0057620 A1 | 3/2008 | Pratt |
| 2008/0081398 A1 | 4/2008 | Lee et al. |
| 2008/0150089 A1 | 6/2008 | Kwon et al. |
| 2008/0308946 A1* | 12/2008 | Pratt ............................ 257/777 |
| 2009/0007934 A1 | 1/2009 | Hutto |
| 2009/0014859 A1 | 1/2009 | Jeung et al. |
| 2009/0057912 A1 | 3/2009 | Kheng |
| 2009/0146312 A1 | 6/2009 | Sulfridge |
| 2009/0166846 A1* | 7/2009 | Pratt et al. ..................... 257/698 |
| 2009/0243045 A1 | 10/2009 | Pagaila et al. |
| 2009/0283898 A1 | 11/2009 | Janzen et al. |
| 2009/0315154 A1 | 12/2009 | Kirby et al. |
| 2009/0321947 A1 | 12/2009 | Pratt |
| 2010/0096759 A1 | 4/2010 | Kirby et al. |
| 2011/0089539 A1* | 4/2011 | Akram et al. .................. 257/620 |
| 2012/0309128 A1 | 12/2012 | Janzen et al. |
| 2013/0134605 A1 | 5/2013 | Pratt |
| 2013/0214421 A1 | 8/2013 | Janzen et al. |

OTHER PUBLICATIONS

Trigas, C., "System-In-Package or System-On-Chip?," EE Times, Sep. 19, 2003, <http://www.eetimes.com/story/OEG20030919S0049>.

Cheung, T.S.D. et al., "On-Chip Interconnect for mm-Wave Applications Using an All-Copper Technology and Wavelength Reduction," 2003 IEEE International Solid-State Circuits Conference.

Lee, T.K. et al., "A Novel Joint-in-Via Flip-Chip Chip-Scale Package," IEEE Transactions on Advanced Packaging, vol. 29, No. 1, pp. 186-194, Feb. 2006.

* cited by examiner

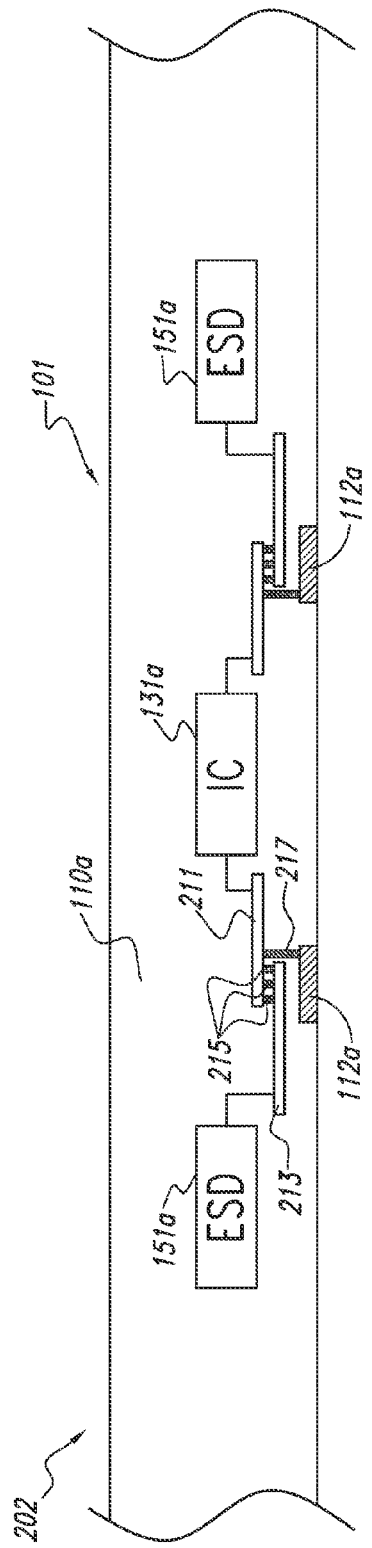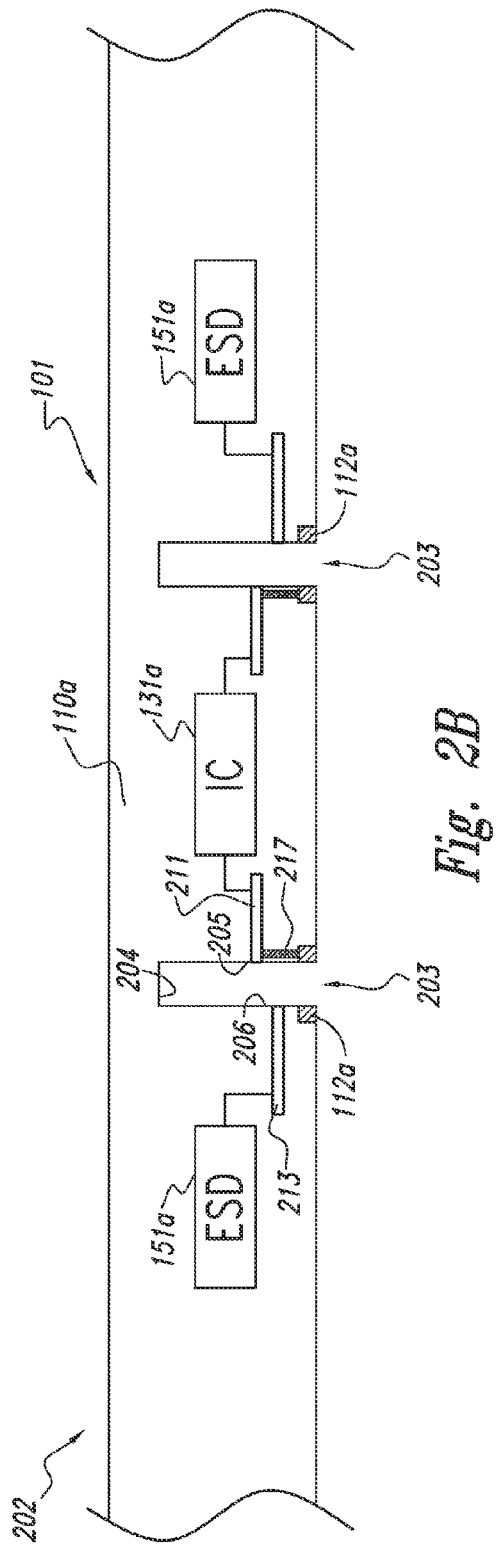

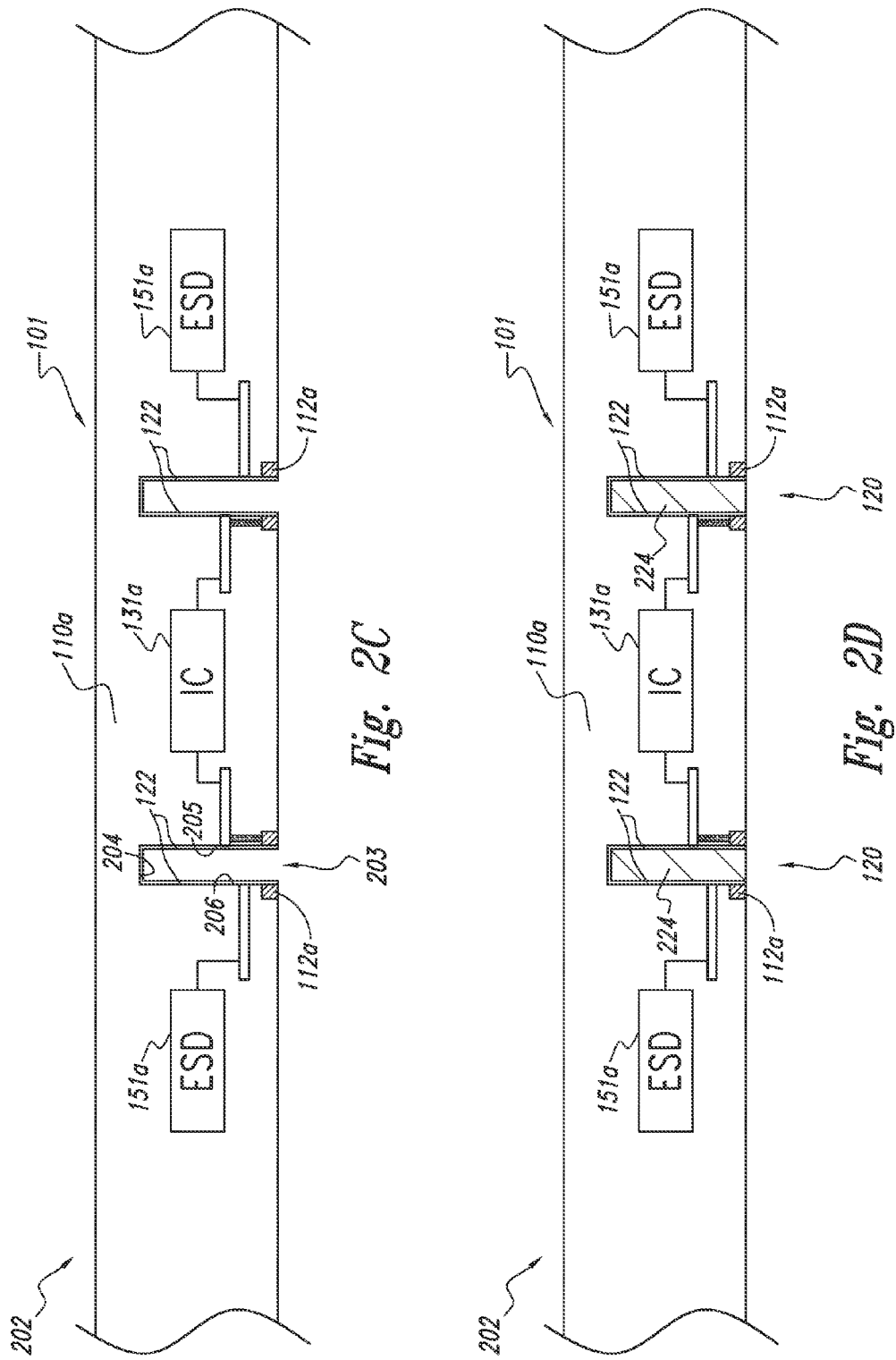

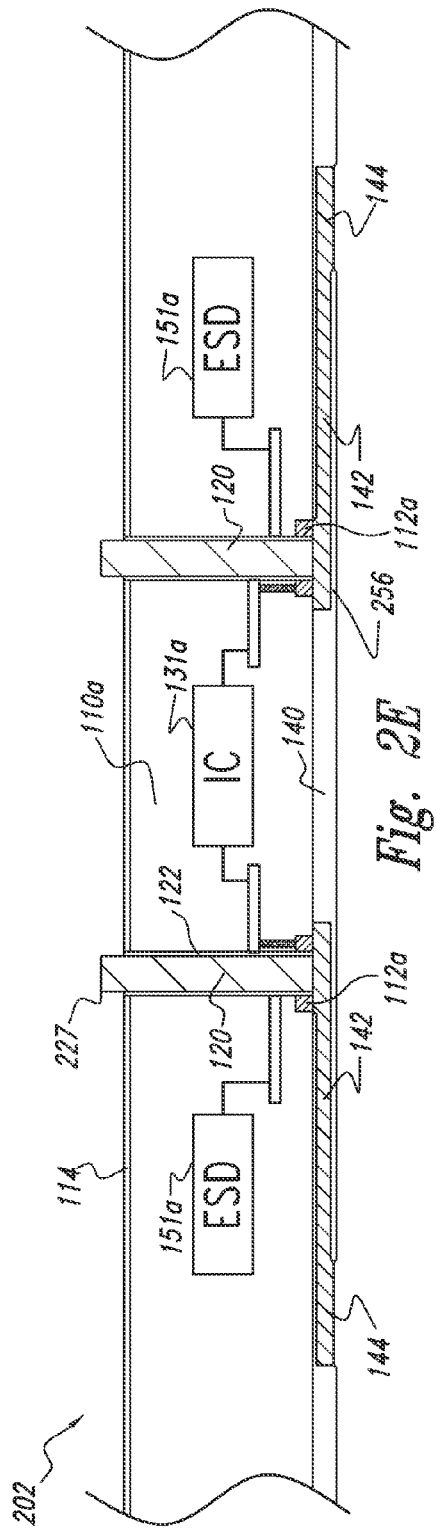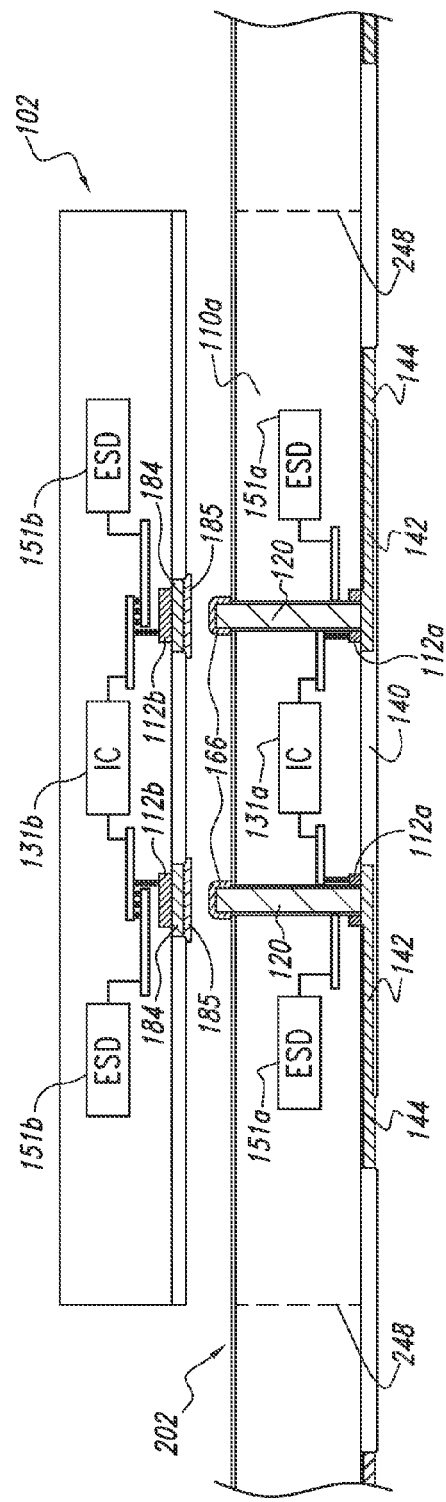

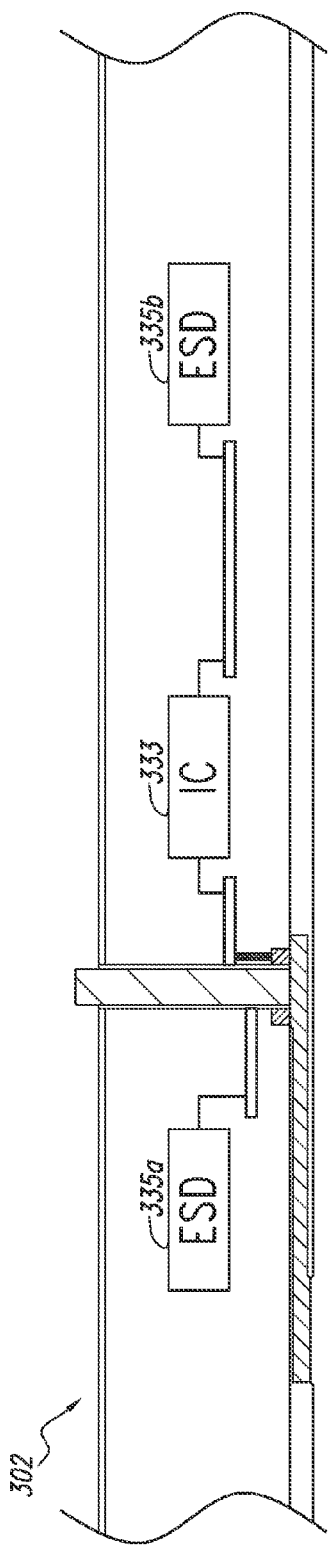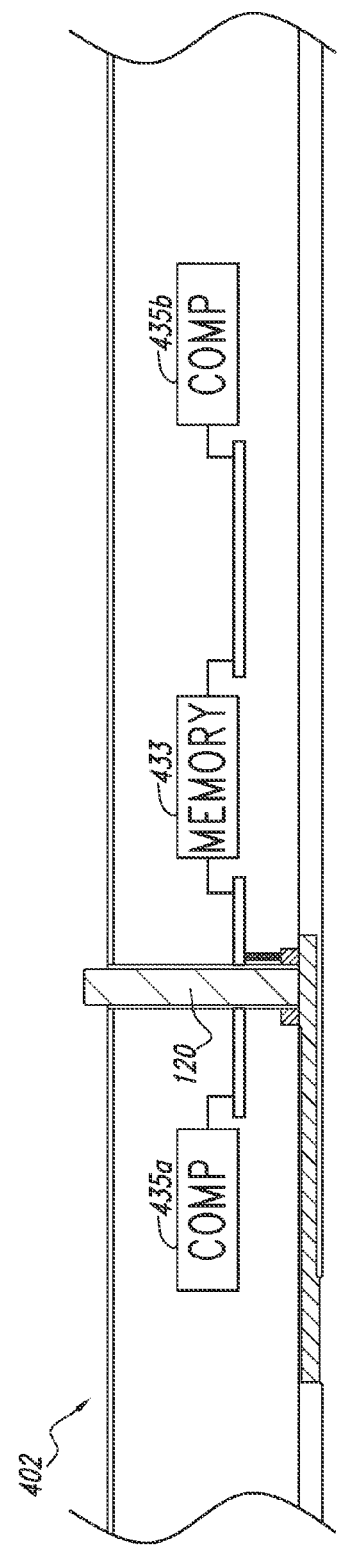

DISABLING ELECTRICAL CONNECTIONS USING PASS-THROUGH 3D INTERCONNECTS AND ASSOCIATED SYSTEMS AND METHODS

CROSS-REFERENCE TO RELATED APPLICATIONS

This application is a continuation of U.S. application Ser. No. 13/850,803 filed Mar. 26, 2013, now U.S. Pat. No. 8,772,086, which is a continuation of U.S. application Ser. No. 13/572,461 filed Aug. 10, 2012, now U.S. Pat. No. 8,404,521, which is a divisional of U.S. application Ser. No. 12/121,654 filed May 15, 2008, now U.S. Pat. No. 8,253,230, each of which is incorporated herein by reference in its entirety.

TECHNICAL FIELD

The present disclosure is directed generally to microelectronic die packages, and more particularly to stacked microelectronic dies having through-die or through-layer interconnects.

BACKGROUND

Packaged microelectronic assemblies, such as memory chips and microprocessor chips, typically include a microelectronic die mounted to a substrate and encased in a plastic protective covering. The die includes functional features, such as memory cells, processor circuits, and interconnecting circuitry. The die also typically includes bond pads electrically coupled to the functional features. The bond pads are electrically connected to pins or other types of terminals that extend outside the protective covering for connecting the die to busses, circuits, or other microelectronic assemblies. In one conventional arrangement, the die is mounted (face down) to a supporting substrate (e.g., a printed circuit board), and the die bond pads are electrically coupled to corresponding bond pads of the substrate with metal bumps (e.g., solder balls or other suitable connections). After encapsulation, a ball-grid array on the backside of the substrate or other arrays of additional metal bumps can electrically connect the substrate to one or more external devices. Accordingly, the substrate supports the die and electrically connects the die to the external devices.

Die manufacturers have come under increasing pressure to reduce the volume occupied by the dies and yet increase the capacity of the resulting encapsulated assemblies. To meet these demands, die manufacturers often stack multiple dies on top of each other to increase the capacity or performance of the device within the limited surface area on the circuit board or other element to which the dies are mounted.

BRIEF DESCRIPTION OF THE DRAWINGS

FIGS. 2A-F illustrate stages of methods for forming the system of FIG. 1A in accordance with several embodiments of the disclosure.

FIG. 3 is a cross-sectional side view of a microelectronic workpiece configured in accordance with another embodiment of the disclosure.

FIG. 4 is a cross-sectional side view of a microelectronic workpiece configured in accordance with yet another embodiment of the disclosure.

DETAILED DESCRIPTION

Various embodiments of pass-through 3D interconnects, such as through-die or through-silicon vias, and microelectronic dies and/or systems of dies that include such interconnects are described below. The term "interconnect" may encompass various types of conductive structures that extend at least partially through a substrate of a microelectronic die and electrically couple together conductive contacts located at opposing ends of the interconnect. The term "substrate" may encompass any of a variety of conductive and/or non-conductive layers (e.g., metallic, semi-conductive, and/or dielectric materials) that are situated upon and/or within one another. Such substrates can include any of a myriad of electrical devices (e.g., transistors, resistors, capacitors, etc.) or systems of such devices (e.g., an integrated circuit, a memory, a processor, etc.) formed in the conductive and/or nonconductive layers of an individual substrate. Other embodiments of pass-through interconnects, substrates, and microelectronic dies and/or systems of dies that include such interconnects and substrates, in addition to or in lieu of the embodiments described in this section, may have several additional features or may not include many of the features shown and described below with reference to FIGS. 1-5.

Figure 1A:
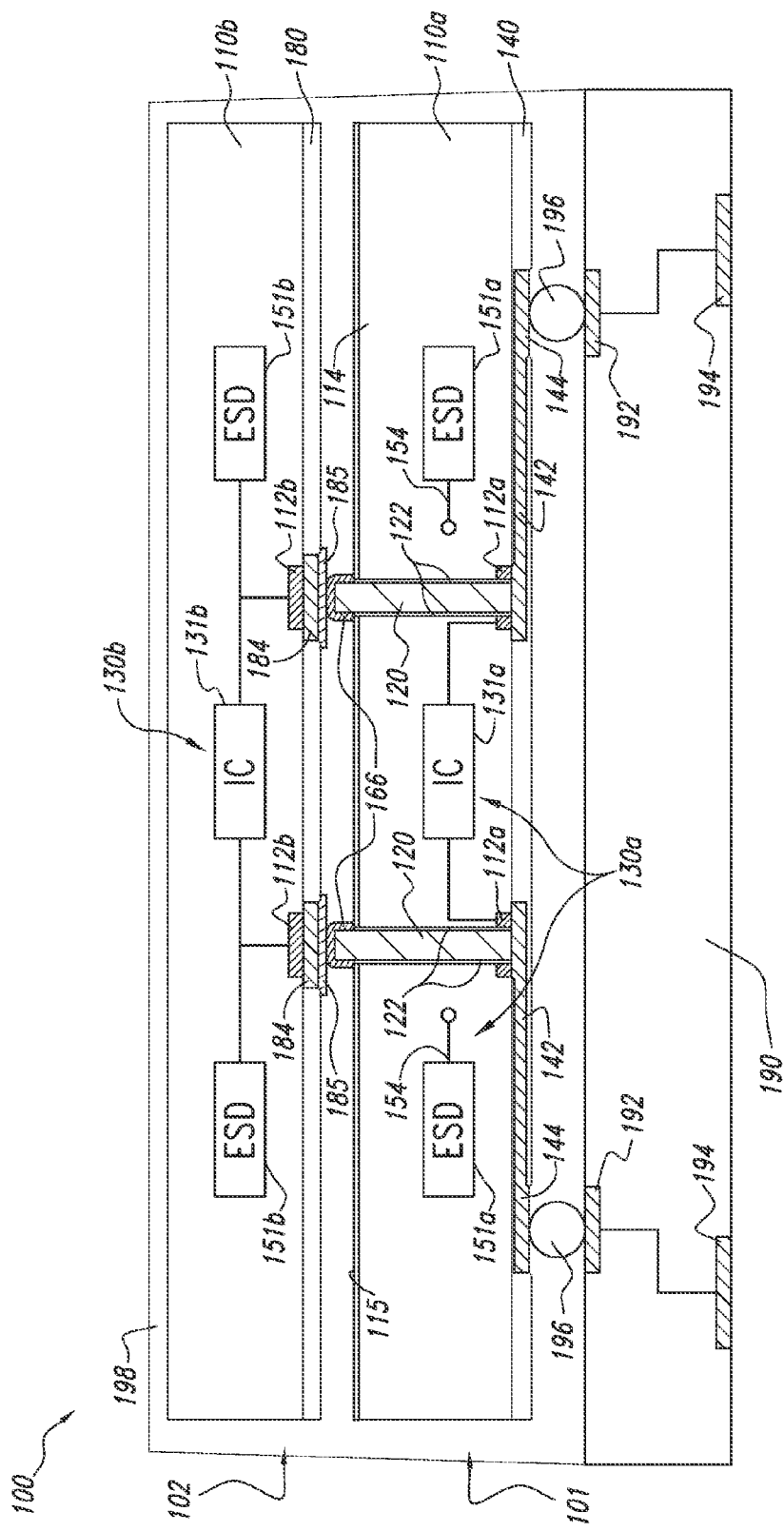
FIG. 1A is a cross-sectional side view of a system of stacked microelectronic dies having electrostatic discharge components configured in accordance with an embodiment of the disclosure.

FIG. 1A is a cross-sectional side view of an embodiment of a system 100 having a first microelectronic die 101 and a second microelectronic die 102 stacked on the first die 101. The first die 101 includes a first substrate 110a, a plurality of pass-through 3D interconnects 120 extending through the first substrate 110a, and a first integrated circuit 130a electrically coupled to the interconnects 120. The first substrate 110a can be a silicon substrate or another suitable semiconductor substrate. The first integrated circuit 130a is shown schematically, and it will be appreciated that the first integrated circuit 130a is within a large portion of the first substrate 110a. The first die 101 can also include a plurality of first substrate pads 112a located at corresponding interconnects 120 and electrically coupled to the first integrated circuit 130a. In the embodiment shown in FIG. 1A, the first die 101 further includes dielectric liners 122 along the interconnects 120, a backside dielectric layer 114 defining a backside surface 115, and a redistribution layer (RDL) 140 having RDL traces 142 with contacts 144. The dielectric liners 122 electrically isolate the individual interconnects 120 from the first substrate 110a and the first substrate pads 112a, and the RDL traces 142 electrically couple the first substrate pads 112a and the corresponding interconnects 120 to the contacts 144.

The second die 102 can have a second substrate 110b with second contact pads 112b and a front side structure 180 having front side contacts 184 arranged in the pattern of the interconnects 120 of the first die 101. The second die 102 can also optionally include a second integrated circuit 130b electrically coupled to the second substrate pads 112b. The second substrate 110b can also be a silicon substrate or another suitable semiconductor substrate, and the second integrated circuit 130b is also shown schematically and can be within a large portion of the second substrate 110b. In many embodiments, metal bonds 166 can electrically coupled the front side contacts 184 of the second die 102 to corresponding interconnects 120 of the first die 101. In other embodiments, electrical connectors, such as solder balls, can be used in lieu of the metal bonds 166.

Figure 1B:
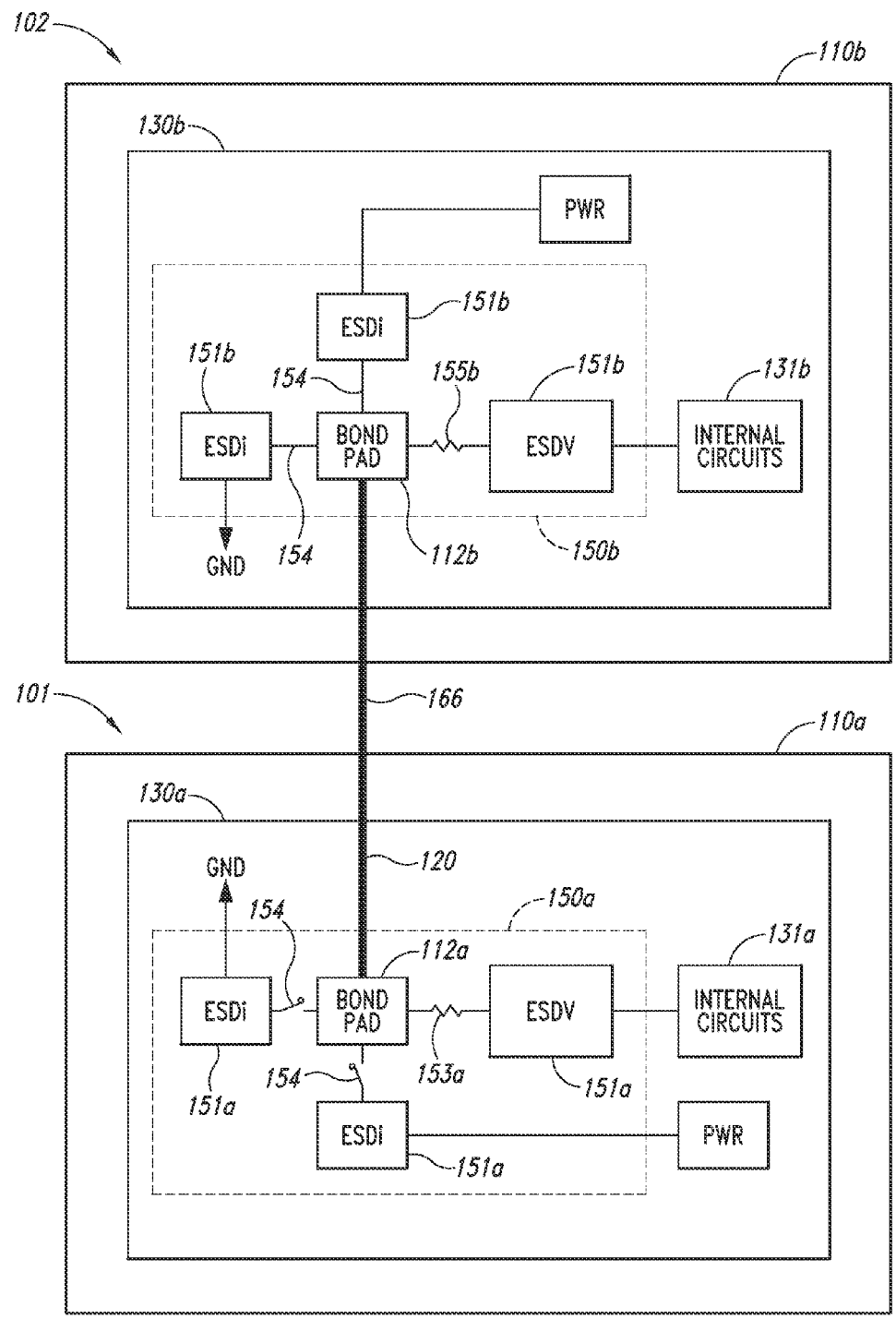
FIG. 1B is a schematic view of a system of stacked microelectronic dies in accordance with an embodiment of the disclosure.

FIG. 1B schematically illustrates an embodiment of the first and second integrated circuits 130 a-b in greater detail. The first integrated circuit 130a of the first die 101 can include internal circuitry 131a and a first electrostatic discharge system 150a, and the second integrated circuit 130b of the second die 102 can include internal circuitry 131b and a second electrostatic discharge system 150b. The first electrostatic discharge system 150a can include one or more first electrostatic discharge (ESD) devices 151a, and the first ESD devices 151a can include temporary ESD devices and/or permanent ESD devices depending on the application. For example, the temporary first ESD devices 151a can be current ESD devices (ESDi) that are temporarily coupled to the first substrate pad 112a and power or ground, and the permanent first ESD devices 151a can be voltage ESD devices (ESDV) coupled to the first substrate pad 112a via a resistor 153a and the internal circuitry 131a. The second electrostatic discharge system 150b can include one or more second ESD devices 151b that can include current ESD devices (ESDi) coupled by lines 154 and voltage ESD devices (ESDV) coupled via a resistor 155b; in many embodiments all of the second ESD devices 151b remain electrically coupled to internal circuitry. In many applications, the electrostatic discharge systems 150a-b have one or more ESD devices associated with each substrate pad (e.g., one or more current and/or voltage ESD device for each substrate pad).

Referring to FIGS. 1A and 1B together, selected first ESD devices 151a are electrically isolated from the other components of the first integrated circuit 130a at one or more stages of the fabrication process. For example, in the specific embodiment shown in FIG. 1B, the ESDi devices have been electrically isolated from the substrate pad 112a and interconnect 120, but ESDV devices remain electrically connected to the internal circuitry 131a. In other embodiments, all of the first ESD devices 151a can be temporary devices that are eventually disconnected from the other components of the first integrated circuit 130a.

Referring to FIG. 1A, the selected first ESD devices 151a can be electrically isolated from the other components of the first integrated circuit 130a by forming the dielectric liners 122 between the selected first ESD devices 151a and the interconnects 120. For example, a dielectric liner 122 can be formed to cause a break in a line 154 that previously connected a selected first ESD device 151a to a corresponding first substrate pad 112a. As such, selected first ESD devices 151a can be effectively disabled or disconnected in the packaged system 100. In other embodiments, all of the first ESD devices 151a can be electrically disconnected or disabled at one or more stages of the fabrication process.

Unlike the first die 101, however, the second ESD devices 151b are not electrically isolated from an integrated circuit. The second ESD devices 151b can remain electrically coupled to the other components of the second integrated circuit 130b, and the second ESD devices 151b can also be electrically coupled to the first integrated circuit 130a via a conductive path that includes an individual contact 184, a conductive layer 185, an individual metal bond 166, and an individual interconnect 120. In other embodiments, the second ESD devices 151b can be separate components in the second die 102 that are not electrically coupled to the second integrated circuit 130b.

In general, the ESD systems 150a-b are configured to protect an integrated circuit from an ESD event. An ESD event typically involves the transfer of energy between an integrated circuit and another body that is at a different electrical potential than the integrated circuit. For example, during the manufacturing of the second die 102, an equipment operator can inadvertently touch and transfer an electrostatic potential to one of the substrate pads 112b. Without the protection of the second ESD system 150b, the transferred electrostatic potential can deliver a large electrical charge that could damage charge-sensitive portions of the second integrated circuit 130b. Even without making physical contact with a substrate pad, ESD events can also be caused by ionized ambient discharges (e.g., sparks) between a substrate pad and other charged bodies brought into close proximity with the substrate pad.

Embodiments of the ESD systems 150a-b can include circuit elements that divert potentially damaging charges away from a corresponding integrated circuit and/or charge-sensitive portions of the integrated circuit. In many embodiments, individual ESD devices include one or more diodes, metal-oxide-silicon (MOS) devices, and/or silicon-controlled rectifiers (SCRs) that are electrically coupled with a corresponding integrated circuit. In the specific embodiments of FIGS. 1A and 1B, the second ESD devices 151b are components of the second integrated circuit 130b and in a parallel circuit configuration with the first integrated circuit 130a. The selected first ESD devices 151a that have been disabled, on the other hand, do not provide ESD protection to the first integrated circuit 130a or the second integrated circuit 130b when the system 100 is completely finished. However, before breaking the electrical connections 154 associated with the selected first ESD devices 151a, the selected first ESD devices 151a can provide temporary ESD protection to the first integrated circuit 130a. The connections 154 associated with the selected or temporary first ESD devices 151a can be disabled prior to (or during) the assembly of the system 100. In many embodiments, disabling the electrical connections associated with the selected first ESD devices 151a can be carried out when forming the interconnects 120, and in this case the first ESD devices 151a that remain electrically coupled to the first integrated circuit can protect the first integrated circuit during formation of the interconnects 120 (e.g., the ESDV devices shown in FIG. 1B).

In contrast to the system 100, conventional dies in stacked packages typically have an ESD device dedicated to each connection between a substrate pad and an integrated circuit. The ESD devices at one level of the conventional die stack are coupled to the ESD devices at another level of the conventional die stack. This creates multiple levels of ESD devices interconnected with one another. In general, a large number of ESD devices are redundant, and a single ESD device for each group of interconnected substrate pads is sufficient for protecting integrated circuits at all levels of the die stack. Removing or disabling ESD devices from only some of these dies and not others would require that the dies have a different configuration of integrated circuitry. This would accordingly require die manufacturers to fabricate separate workpieces to create the different integrated circuits. Thus, package manufacturers typically do not selectively disable or remove ESD devices. Unfortunately, as the performance of devices increases, die packages with redundant ESD devices can impair performance because the components of ESD devices typically introduce a signal delay, and intercoupling multiple ESD devices can exacerbate the signal delay.

Embodiments of the system 100, however, overcome the tradeoff between overall performance and manufacturing costs. In many embodiments, electrical connections with ESD devices can be disabled at little or no additional cost such that the system 100 does not employ redundant ESD devices. In several embodiments, the ESD devices can be selectively disable in the normal process of fabrication interconnects by forming selected interconnects through one or more metal layers, traces, and/or vias that complete the temporary conductive path between an ESD device and an integrated circuit. This process not only forms the interconnect but also removes conductive material to disconnect or otherwise disable the ESD device at the same time. In additional embodiments, electrical isolation can also be provided by a dielectric layer that separates the interconnect from the substrate.

Embodiments of the system 100 can also include a dielectric casing 198 encapsulating the first and second dies 101 and 102 and an interposer substrate 190 carrying the first and second dies 101 and 102. The interposer substrate 190, for example, can be a printed circuit board or other substrate that includes die bond pads 192 and package bond pads 194 electrically coupled to the die bond pads 192 through the interposer substrate 190. In several embodiments, individual bump bonds 196 or other electrical connectors are aligned with and attached to individual RDL contacts 144 of the first die 101 and individual die bond pads 192 of the interposer substrate 190. Accordingly, individual package bond pads 194 can provide an electrical coupling to the first integrated circuit 130a of the first die 101, the second integrated circuit 130b, and the second ESD devices 151b of the second die 102.

FIGS. 2A-F illustrate stages of methods for forming the system 100 and selectively disabling electrical connections with ESD devices in accordance with several embodiments of the disclosure. FIG. 2A is a cross-sectional side view of a microelectronic workpiece 202 (e.g., a semiconductor or microelectronic wafer) at a stage of forming an embodiment of the first die 101. The workpiece 202 includes the first substrate 110a, the internal circuitry 131a, selected first ESD devices 151a, and corresponding first substrate pads 112a. In the embodiment of FIG. 2A, the internal circuitry 131a is electrically coupled to a first metal layer 211 and the first ESD devices 151a are electrically coupled to a second metal layer 213. The first metal layer 211 can be electrically coupled to the second metal layer 213 by conductive vias 215, and thus the first ESD devices 151a are electrically coupled to the internal circuitry 131a at this stage of the process. The workpiece 202 also includes second vias 217 that electrically couple the internal circuitry 131a and the first ESD devices 151a to the first substrate pads 112a.

In many embodiments, the first metal layer 211, the second metal layer 213, the first vias 215, and the second via 217 are formed during a back end of the line (BEOL) process. For example, the first and second metal layers 211 and 213 can include aluminum, copper, or another metal that has been formed above semiconductor devices (not shown) of the integrated circuit. This metal can be patterned to define electrical connections of the integrated circuit and can include passivation layers (not shown) that separate individual levels of metal from one another. The first and second vias 215 and 217 can also be formed in a BEOL process and can include a metallic material (e.g., copper or tungsten). The vias 215 and 217 can extend through individual passivation layers to provide the electrical couplings between (a) the first and second metal layers 211 and 213 and (b) the first metal layer 211 and the first substrate pads 112a. In additional or alternative embodiments, other arrangements of vias or interconnect structures can be used to interconnect metal layers and substrate pads. For example, two or more vias can couple the first metal layer 211 to the substrate pad 144 and/or a single via can couple the first metal layer 211 to the second metal layer 213. Further, the number of vias and interconnect structures can also be based on the magnitude of a typical electrical current carried by the first metal layer 211 and/or the second metal layer 213.

FIG. 2B is a cross-sectional side view of the workpiece 202 at a subsequent stage after forming holes 203 extending at least partially through the workpiece 202. An individual hole 203 is formed through the substrate pad 112a, and the hole 203 includes an endwall 204, a first sidewall 205 that is adjacent to the first metal layer 211, and a second sidewall 206 that is adjacent to the second metal layer 213. In many embodiments, an etching process forms the hole 203 using single- or multi-step wet/dry etching techniques, laser drilling/ablation methods and/or silicon machining techniques (e.g., micro-electro-discharge-machining, abrasive machining, sand blasting, and/or cryogenic etches). The etching process can form the holes 203 such that the first vias 215 (FIG. 2A) are removed from the workpiece 202 and the selected first ESD devices 151a are disconnected from the internal circuitry 131a. The etching process, however, does not remove the second vias 217 from the workpiece 202 so that the internal circuitry 131a remains electrically coupled to the substrate pads 112a. In other embodiments, the holes 203 can be formed other locations in the workpiece 202 to disconnect the selected first ESD device 151a without removing the first vias 215. For example, in an alternative embodiment, an etching process can form the holes 203 in the second metal layer 213 such that a portion of the second metal layer 213 is removed from the workpiece 202 and the selected first ESD devices 151a are electrically disconnected from the internal circuitry 131a.

FIG. 2C is a cross-sectional side view of the workpiece 202 at a subsequent stage after forming a dielectric liner 122 along the endwall 204 and the sidewalls 205 and 206 of the hole 203. The dielectric liner 122 may initially be globally deposited on the workpiece 202, and a wet/dry etch can remove portions of the dielectric layer 122 that are not located within the hole 203. In many embodiments, the dielectric liner 122 includes a nonconductive material that can be deposited at low temperatures, such as materials that can be deposited using chemical vapor and/or physical vapor deposition (CVD and/or PVD) processes. For example, the dielectric liner 122 can include a phosphosilicate glass (PSG) or other type of organic or inorganic dielectric coating material.

FIG. 2D is a cross-sectional side view of the workpiece 202 at a subsequent stage after forming the interconnects 120. A seed layer (not shown) can be formed on the surfaces of the dielectric liner 122 within the hole 203 (FIG. 2C), and individual metal layers 224 can be plated onto the seed layer. For example, the seed layer can be a conductive material, such as copper, and may receive an electrical potential for initiating plating of the metal layer 224. In other embodiments, however, an electroless plating process can form the metal layer 224. Also, while the interconnect 120 is shown as being completely filled by the metal layer 224, in other examples, the interconnect 120 may be only partially filled by the metal layer 224. For example, the interconnect 120 can include an opening extending through the center of the metal layer 224. In many embodiments, the metal layer 224 can include copper, gold, nickel, and/or palladium.

FIG. 2E is a cross-sectional side view of the workpiece 202 at a subsequent stage after thinning the first substrate 110a and depositing the dielectric layer 114. The first substrate 110a can be thinned using chemical etching, backgrinding, chemical-mechanical polishing, and/or plasma thinning techniques. Such a process can be carried out in single or multiple steps and can also include selectively removing substrate material from the first substrate 110a to define a projection portion 227 of the interconnect 120. After thinning the first substrate 110, the dielectric layer 114 can be deposited at the back-side surface of the first substrate 110a. For example, the dielectric layer 114 can be spun-on such that the dielectric layer 114 covers the back-side surface of the first substrate 110a but does not cover the projection portion of the interconnect 227. In several embodiments, an additional etching process can remove portions of the dielectric liner 122 from the sidewalls of the projection portion 227 using, for example, a dilute hydrofluoric (HF) etch. FIG. 2E also shows the redistribution layer 140 including the RDL traces 142, the RDL contacts 144, and a passivation layer 256 encapsulating the RDL traces 142 and defining locations of the RDL contacts 144.

FIG. 2F is a partially exploded, cross-sectional side view of the workpiece 202 during inter-die bonding and the die singulation stage. At this stage, second die 102 is aligned with and electrically connected to the first die 101 by forming the metal bonds 166 between the RDL contacts 184 of the second die 102 and the interconnects 120 of the first die 101. The substrate 110a may include fiducials or other types of alignment markers for accurate alignment between the RDL contacts 184 and the interconnects 120, and various types of direct bonding techniques can be employed for forming the metal bonds 166. For example, bonding techniques such as copper-to-copper bonding, copper-to-tin bonding, oxide bonding, and electroplating may be used to electrically intercouple the RDL connects 184 with the interconnects 120. The second die 102 can also be optionally attached to the first die 101 with an adhesive layer (not shown). After electrically connecting the second die 102 to the first die 101, the first die 101 can be singulated from the workpiece 202 via a die cutting process at substrate cutting lanes 248 to separate the assembly of the first and second dies 101 and 102 from the workpiece 202. The assembly of the first and second dies 101 and 102 can then be mounted and electrically coupled to a variety of substrates, such as the interposer substrate 190 (FIG. 1A). In other embodiments, this assembly can be coupled with other types of structures for carrying and/or electrically coupling with the first and second dies 101 and 102.

Alternative manufacturing techniques can be employed in other examples of fabricating a workpiece. For example, FIG. 3 is a cross-sectional side view showing an embodiment of a workpiece 302 carrying internal circuitry 333, a temporary ESD device 335a electrically isolated from the internal circuitry 333, and a permanent ESD device 335b electrically coupled to the internal circuitry 333. The embodiment shown in FIG. 3 can be similar to the first die 101 shown in FIG. 1B. The temporary ESD device 335a can be electrically isolated from the internal circuitry 333 in a similar manner to that described with reference to FIGS. 2A-F. The permanent ESD device 335b, on the other hand, can provide ESD protection to the internal circuitry 333 during subsequent manufacturing of the workpiece 302. In several embodiments, the permanent ESD device 335b has a smaller footprint than the temporary ESD device 335a and introduces less signal delay than the temporary ESD device 335a. Thus, the permanent ESD device 335b may not be as effective at ESD protection as the temporary ESD device 335a, but the permanent ESD device 335b can provide a measure of ESD protection during manufacturing between the time when the temporary ESD device 335a is electrically isolated from the internal circuitry 333 and the time when the internal circuitry 333 is electrically coupled to the second ESD device 335b of the second die 102 (FIG. 1A).

Embodiments of workpieces and stacked systems can also employ interconnects for electrically isolating integrated circuits and other types of circuit components, in addition to or in lieu of ESD devices. For example, FIG. 4 is a cross-sectional side view showing an embodiment of a workpiece 402 carrying a memory 433, a first memory component 435a electrically isolated from the memory 433, and a second memory component 435b electrically coupled to the memory 433. The memory 433, for example, can be a programmable memory, and the process of forming the interconnect 120 can be used to program the memory 433 by disabling the functionality of the first memory component 435a. Such a programming implementation can be similar in nature to permanently programming a field programmable gate array (FPGA). However, instead of using electrical potentials to selectively hardwire the memory, the process of forming the interconnect can selectively hardwire the memory 433.

Figure 5:
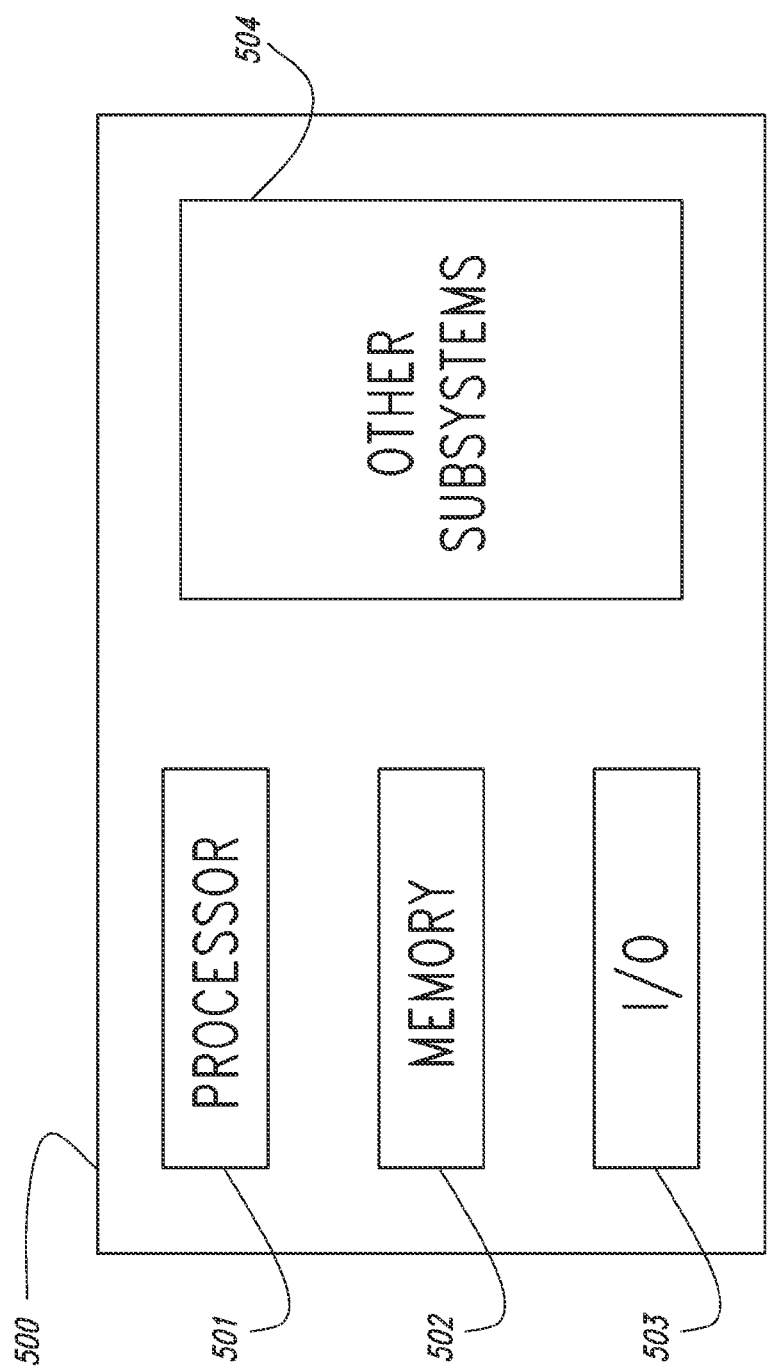
FIG. 5 is a schematic illustration of a system in which embodiments of microelectronic dies having electrostatic discharge components with disabled electrical connections may be incorporated.

Any one of the microelectronic dies having ESD devices with disabled electrical connections described above with reference to FIGS. 1A-4 can be incorporated into any of a myriad of larger or more complex systems 500, a representative one of which is shown schematically in FIG. 5. The system 500 can include a processor 501, a memory 502 (e.g., SRAM, DRAM, Flash, or other memory device), input/output devices 503, or other subsystems or components 504. Microelectronic devices may be included in any of the components shown in FIG. 5. The resulting system 500 can perform any of a wide variety of computing, processing, storage, sensor, imaging, or other functions. Accordingly, representative systems 500 include, without limitation, computers or other data processors, for example, desktop computers, laptop computers, Internet appliances, hand-held devices (e.g., palm-top computers, wearable computers, cellular or mobile phones, and personal digital assistants), multi-processor systems, processor-based or programmable consumer electronics, network computers, and minicomputers. Other representative systems 500 include cameras, light or other radiation sensors, servers and associated server subsystems, display devices, or memory devices. In such systems, individual dies can include imager arrays, such as CMOS imagers. Components of the system 500 may be housed in a single unit or distributed over multiple, interconnected units, e.g., through a communications network. Components can accordingly include local or remote memory storage devices and any of a wide variety of computer-readable media.

From the foregoing, it will be appreciated that specific embodiments have been described herein for purposes of illustration, but well-known structures and functions have not been shown or described in detail to avoid unnecessarily obscuring the description of the embodiments. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature or additional types of other features are not precluded.

It will also be appreciated that specific embodiments have been described herein for purposes of illustration but that various modifications may be made within the claimed subject matter. For example, in addition to or in lieu of the redistribution layers, embodiments of the stacked system 100 can employ other types of intra-die electrical couplings between dies or between a die and an interposer substrate. In addition, the described methods of disabling electrical connections to ESD devices can include various modifications. Referring to FIG. 1A, for example, electrical connections can be disabled at metal layers located within the substrate 140 or at metal layers located within a redistribution layer 140. Furthermore, many of the elements of one embodiment can be combined with other embodiments in addition to, or in lieu of, the elements of the other embodiments. Accordingly, the invention is not limited except as by the appended claims.

We claim:

1. A system of stacked microelectronic dies, comprising:
   a first microelectronic die including a backside, an integrated circuit, first electrostatic discharge (ESD) devices, and an interconnect extending through the first die to the backside, wherein the interconnects are electrically coupled to the integrated circuit, and wherein selected first ESD devices are electrically isolated from the interconnects; and
   a second microelectronic die including a front side coupled to the backside of the first die, a metal contact at the front side electrically coupled to one of the interconnects, and a second ESD device electrically coupled to the metal contact, wherein the integrated circuit of the first die is electrically coupled to the second ESD device.

2. The system of claim 1, further comprising a metal bond coupling the contact of the second die with one of the interconnects of the first die, wherein the second ESD device is electrically coupled to the integrated circuit via the metal bond.

3. The system of claim 1 wherein the first die further includes a substrate carrying the integrated circuit and the first ESD devices, and wherein the interconnect is positioned in the substrate such that an electrical connection between a selected first ESD device and the interconnect is disabled.

4. The system of claim 1, further comprising a dielectric layer at least partially lining the interconnect and electrically isolating a selected first ESD device from the interconnect.

5. The system of claim 1 wherein the integrated circuit is a first integrated circuit, and wherein the second die includes a second integrated circuit electrically coupled to the second ESD device.

6. The system of claim 1, further comprising an interposer substrate carrying the first and second dies, the interposer substrate including a metal pad electrically coupled to the integrated circuit and the second ESD device, the metal pad also being electrically isolated from the first ESD devices.

7. A microelectronic workpiece, comprising:
   a substrate having a front side and a backside;
   a first circuit and a second circuit carried by the substrate, the first circuit having an integrated circuit, the second circuit having an electrostatic discharge (ESD) device;
   an interconnect extending through the substrate and electrically coupled to the first circuit, the interconnect having a metal layer electrically coupling the front side of the substrate with the backside of the substrate; and
   a dielectric liner along the interconnect between the interconnect and the substrate wherein the dielectric liner electrically isolates the integrated circuit from the ESD device.

8. The microelectronic workpiece of claim 7 wherein the dielectric liner separates the interconnect from the second circuit.

9. An interconnect structure, comprising:
   a first metal layer of a microelectronic die, the microelectronic die having an integrated circuit and an electrostatic discharge (ESD) device;
   a second metal layer of the die being separated from the first metal layer by at least one passivation layer;
   a metal interconnect extending through the die from, at least, a surface at a front side of the die to a surface at a backside of the die, the interconnect also extending through the first metal layer and the second metal layer; and
   a dielectric layer at least partially lining the interconnect and electrically isolating the integrated circuit and the ESD device.

10. The interconnect structure of claim 9 wherein the first metal layer provides a conduction path between the integrated circuit and the interconnect, and the dielectric layer electrically isolates a conduction path between the integrated circuit and the interconnect.

11. The interconnect structure of claim 9 wherein the second metal layer provides a conduction path to the ESD device, and the dielectric layer electrically isolates the conduction path from the first metal layer.

12. The interconnect structure of claim 9 wherein the first and second metal layers are located within a microelectronic substrate carried by the die.

13. The interconnect structure of claim 9 wherein the first and second metal layers are located within a redistribution layer attached to the surface at the front side of the die.

14. The system of claim 1 wherein the first microelectronic die includes a first metal layer and a second metal layer separated from the first metal layer by at least one passivation layer.

15. The system of claim 14 wherein the first metal layer provides a conduction path between the integration circuit and the interconnect.

16. The system of claim 1 wherein the first microelectronic die includes a first metal layer, and wherein the first metal layer provides a first conduction path between the integration circuit and the interconnect.

17. The system of claim 16 wherein the second microelectronic die includes a second metal layer, and wherein the second metal layer provides a second conduction path between the interconnect and the second ESD device.

18. The system of claim 1, further comprising a redistribution layer attached to the first microelectronic die.

19. The system of claim 18 wherein the redistribution layer includes a first metal layer and a second metal layer separated from the first metal layer by at least one passivation layer.

20. The system of claim 19 wherein the first metal layer provides a conduction path between the integration circuit and the interconnect.

21. The microelectronic workpiece of claim 7 wherein the substrate is an interposer substrate having a metal pad electrically coupled to the first circuit.

22. The microelectronic workpiece of claim 21 wherein the metal pad is electrically isolated from the second circuit.

23. The microelectronic workpiece of claim 7, further comprising a redistribution layer attached to the substrate.

24. The microelectronic workpiece of claim 23 wherein the redistribution layer includes a first metal layer and a second metal layer separated from the first metal layer by at least one passivation layer.

25. The microelectronic workpiece of claim 24 wherein the first metal layer provides a conduction path between the first circuit and the interconnect.

26. The interconnect structure of claim 9, wherein the ESD device is a first ESD device, and wherein the interconnect structure further comprises a metal bond electrically coupling the metal interconnect with a second ESD device.

27. The interconnect structure of claim 9, further comprising an interposer substrate carrying the microelectronic die, wherein the interposer substrate including a metal pad electrically coupled to the integrated circuit positioned within the microelectronic die, and wherein the metal pad is electrically isolated from the ESD device positioned within the microelectronic die.

\* \* \* \* \*